(12) United States Patent
Yamada

(10) Patent No.: US 7,091,936 B1
(45) Date of Patent: Aug. 15, 2006

(54) COLOR DISPLAY DEVICE

(75) Inventor: Tsutomu Yamada, Gifu (JP)

(73) Assignee: Sanyo Electric Co., Ltd., (JP)

( * ) Notice: Subject to any disclaimer, the term of this patent is extended or adjusted under 35 U.S.C. 154(b) by 0 days.

(21) Appl. No.: 09/679,097

(22) Filed: Oct. 4, 2000

(30) Foreign Application Priority Data

Oct. 4, 1999 (JP) ................................. 11-283181

(51) Int. Cl.
*G09G 3/30* (2006.01)

(52) U.S. Cl. .......................................... 345/76; 345/77

(58) Field of Classification Search ............ 345/82–83, 345/76–86, 88, 589, 590, 591, 593, 597, 345/600; 315/169.3, 169.1; 348/800–803; 313/483, 500; 430/139
See application file for complete search history.

(56) References Cited

U.S. PATENT DOCUMENTS

| | | | |
|---|---|---|---|
| 4,015,166 A | | 3/1977 | Ohshima et al. |
| 4,810,060 A | * | 3/1989 | Ukai ........................... 349/106 |
| 5,177,406 A | | 1/1993 | Troxell |
| 5,550,066 A | | 8/1996 | Tang et al. |
| 5,684,365 A | * | 11/1997 | Tang ......................... 315/169.3 |
| 5,742,129 A | | 4/1998 | Nagayama et al. |
| 5,798,745 A | * | 8/1998 | Steffensmeier ............... 345/92 |
| 5,818,068 A | * | 10/1998 | Sasaki et al. ................. 257/59 |
| 5,888,858 A | * | 3/1999 | Yamazaki et al. .......... 438/162 |
| 6,072,272 A | * | 6/2000 | Rumbaugh .................. 313/470 |
| 6,072,450 A | | 6/2000 | Yamada et al. |
| 6,091,382 A | | 7/2000 | Shioya et al. |
| 6,121,726 A | * | 9/2000 | Codama et al. ............. 313/504 |
| 6,175,345 B1 | | 1/2001 | Kuribayashi et al. |
| 6,204,610 B1 | * | 3/2001 | Komiya .................... 315/169.3 |
| 6,252,248 B1 | * | 6/2001 | Sano et al. .................... 257/59 |
| 6,366,025 B1 | | 4/2002 | Yamada |
| 6,628,363 B1 | * | 9/2003 | Sano et al. ................. 349/151 |

FOREIGN PATENT DOCUMENTS

| | | | | | |
|---|---|---|---|---|---|
| JP | | 03153219 A | * | 7/1991 | .................. 349/42 |
| JP | | 8234683 | | 9/1996 | |
| JP | | 8241047 | | 9/1996 | |
| JP | | 8241048 | | 9/1996 | |
| JP | | 10039791 | | 2/1998 | |
| JP | | 10039791 A | * | 2/1998 | |
| JP | | 2001-290441 | | 10/2001 | |

OTHER PUBLICATIONS

English Translation of Japanese Patent Laid-Open Publication No. HEI 10-39791, Dated Feb. 13, 1998.

* cited by examiner

*Primary Examiner*—Bipin Shalwala
*Assistant Examiner*—Nitin Patel
(74) *Attorney, Agent, or Firm*—Cantor Colburn LLP (57) ABSTRACT

EL display elements are configured by sequentially laminating an anode, an emissive layer and a cathode, and emit light of R, G, and B. Each EL display element is supplied with a drive current from an EL element driving TFT. The transistor sizes of the EL element driving TFTs connected to the display pixels for respective colors are designated such that the size of the TFT for a green display pixel including an EL element having the highest emissive efficiency is the smallest, and the sizes of the TFTs for red and blue display pixels having sequentially decreasing emissive efficiency are made sequentially larger.

14 Claims, 9 Drawing Sheets

|  | R | | G | | B | | W | |
|---|---|---|---|---|---|---|---|---|
| | x | y | x | y | x | y | x | y |
| CHROMAT-ICITY COORDI-NATE | 0.65 | 0.34 | 0.30 | 0.63 | 0.17 | 0.17 | 0.31 | 0.32 |
| LUMINANCE PERCENTAGE (WITH W AT 100%) | 25(%) | | 46(%) | | 29(%) | | 100(%) | |
| LUMINANCE RATIO (G) | 0.54 | | 1 | | 0.63 | | — | |

Fig. 6

COLOR DISPLAY DEVICE

BACKGROUND OF THE INVENTION

1. Field of the Invention

The present invention relates to a display device using a self-emissive element such as an electroluminescence (hereinafter referred to as "EL") element and a thin film transistor (hereinafter referred to as "TFT").

2. Description of the Related Art

In the recent years, display devices using EL elements, which are self-emissive elements, have gained attention as the display devices that may replace CRTs and LCDs.

Research is being directed to development of display devices using TFTs as the switching elements for driving the EL elements.

Figure 2:
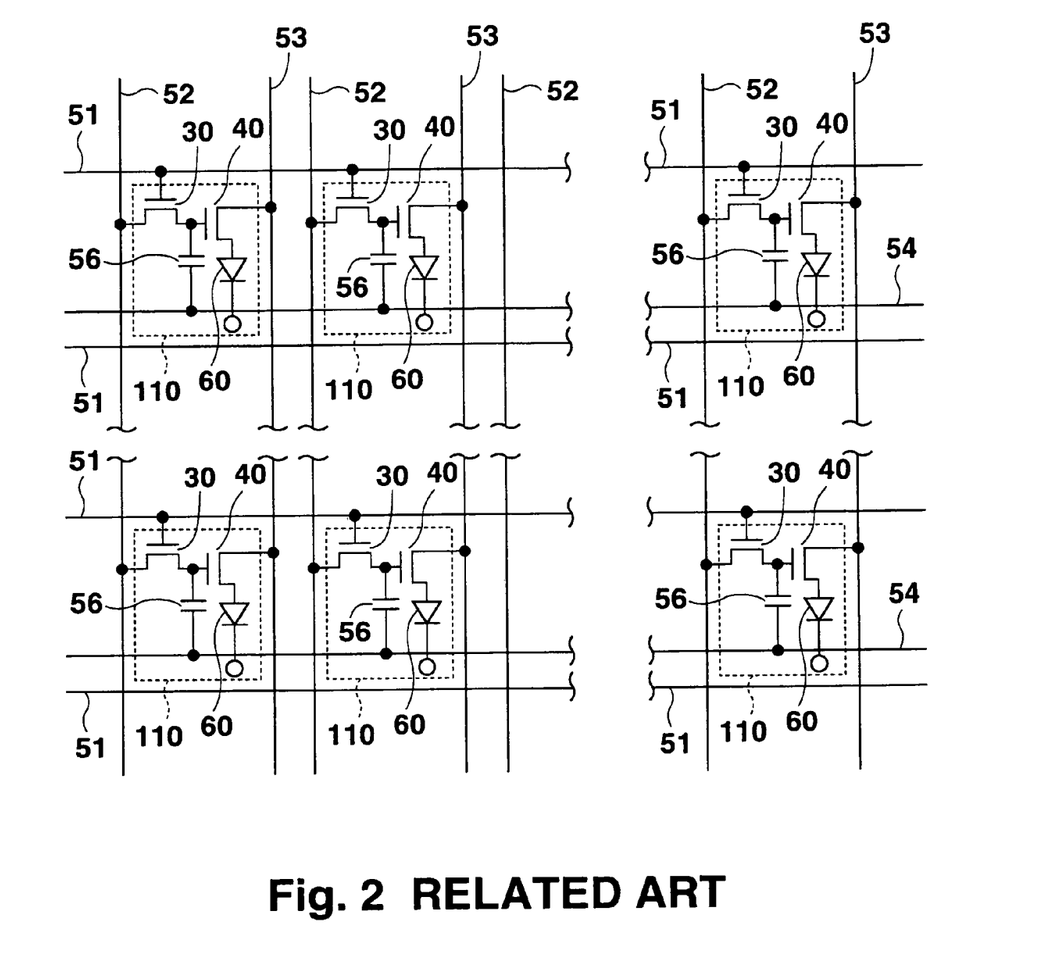
FIG. 2 is a diagram showing an equivalent circuit according to the present invention and the related art.
Figure 3:
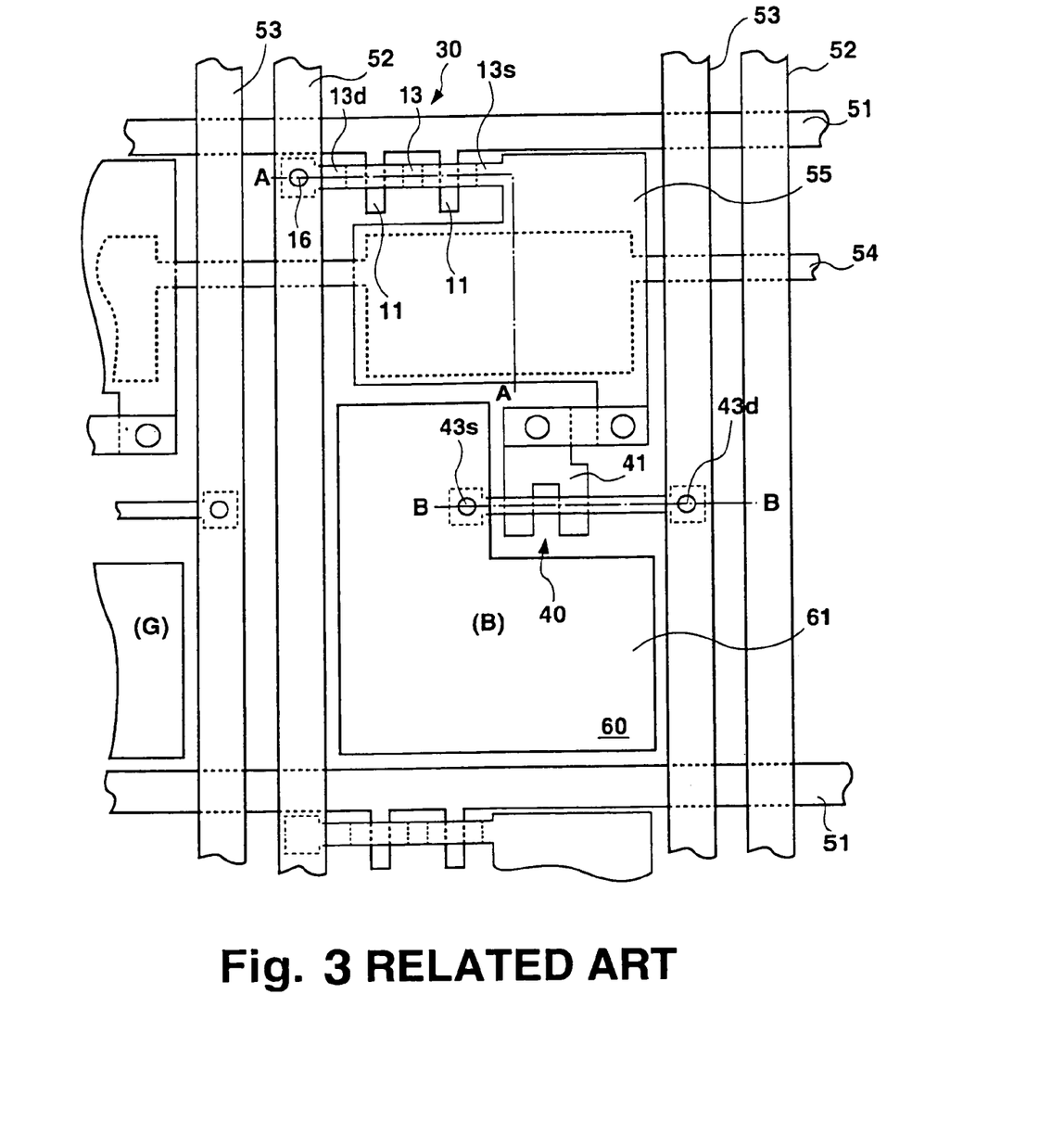
FIG. 3 is a diagram showing a configuration of a display pixel according to the present invention and the related art.
Figure 4A:
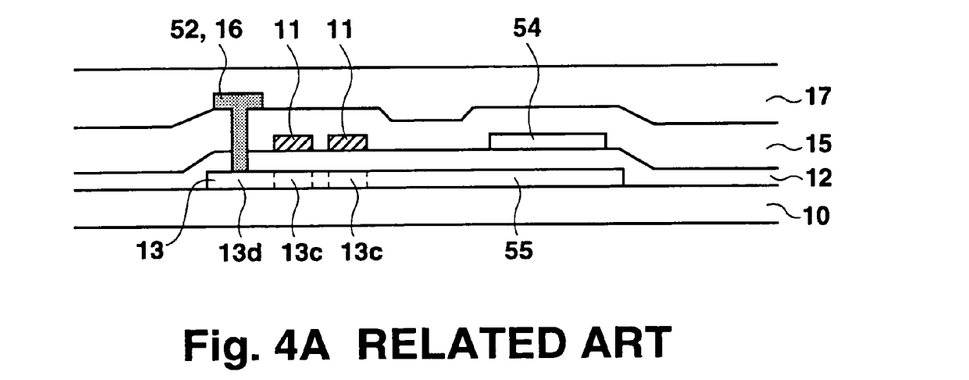
FIG. 4A shows cross-section A—A of FIG. 3.
Figure 4B:
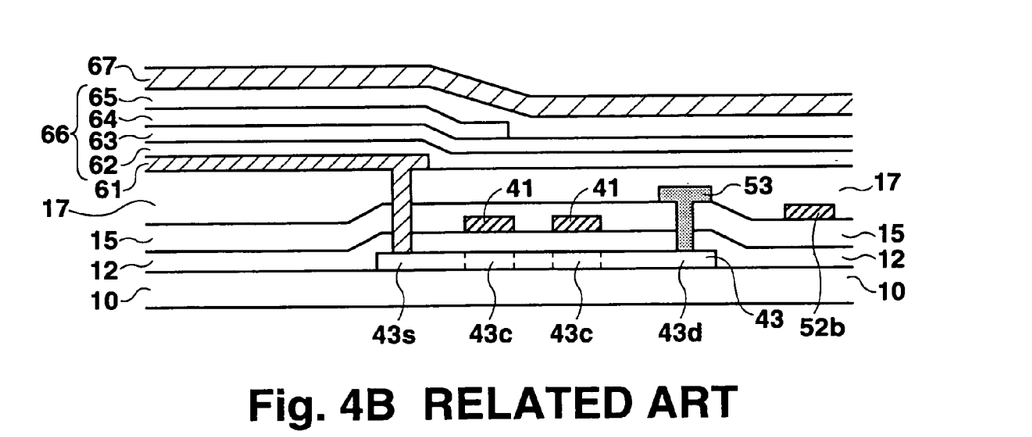
FIG. 4B shows cross-section B—B of FIG. 3.
Figure 5:
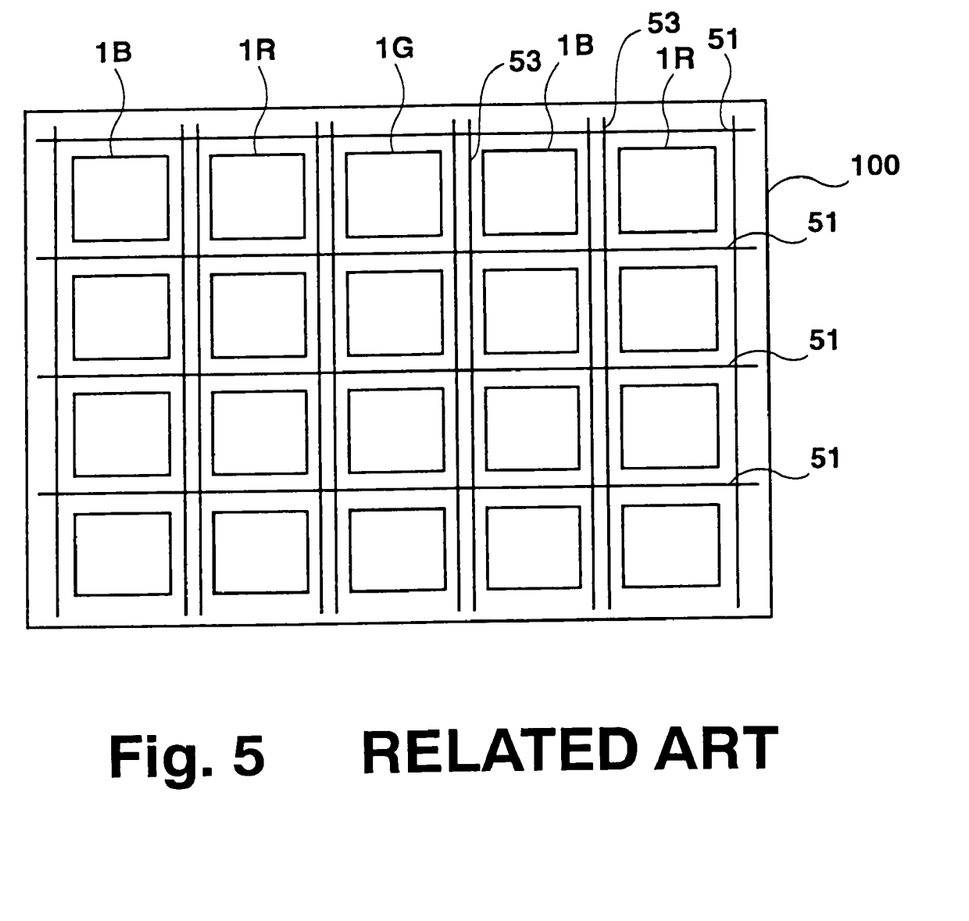
FIG. 5 is a diagram showing an arrangement of display pixels according to the present invention and the related art.

FIG. 2 is an equivalent circuit diagram of a conventional organic EL display device. FIG. 3 is a plan view of the organic EL display device showing an area around a display pixel. FIG. 4A is a cross-sectional view taken along line A—A of FIG. 3, while FIG. 4B shows a cross-sectional view taken along line B—B of FIG. 3. FIG. 5 illustrates the arrangement of display pixels in the organic EL display device.

As shown in FIGS. 2 and 3, display pixels 110 are formed in regions surrounded by gate signal lines 51 and drain signal lines 52. The display pixels 110 are arranged in a matrix. A first TFT 30, which is a switching TFT, is provided in an area near an intersection of the two signal lines 51,52. The source 13s of the TFT 30 concurrently serves as a capacitor electrode 55 which functions together with a storage capacitor electrode line 54 described below to create capacitance. The source 13s is connected to the gate 41 of a second TFT 40 which is an EL element driving TFT. The source 43s of the second TFT 40 is connected to an anode 61 of an organic EL element 60. The drain 43d of the TFT 40 is connected to the power source line 53 which supplies a current to the organic EL element 60.

The storage capacitor electrode line 54 is arranged in parallel to gate signal lines 51. The storage capacitor electrode line 54 is made of a material such as chrome, and forms a storage capacitor 56 by allowing charges to be accumulated between the capacitor electrode 55 connected to the source 13s of the TFT 30 and the storage capacitor electrode line 54, while a gate insulating film 12 is disposed therebetween. The storage capacitor 56 is provided for retaining a voltage applied to the gate electrode 41 of the second TFT 40.

As shown in FIGS. 4A and 4B, the organic EL display device is formed by sequentially laminating TFTs and an organic EL element on a substrate 10 made of an insulating material such as glass or synthetic resin, or, alternatively, a conductive or semiconductor material. When a conductive or semiconductor substrate is used as the substrate 10, an insulating film such as $SiO_2$ or SiN is formed on the substrate 10 before forming the first and second TFTs and the organic EL display element.

The first TFT 30, which is the switching TFT, is first described.

As shown in FIG. 4A, sequentially formed on an insulating substrate 10 made of a material such as quartz glass or non-alkali glass are an active layer 13 composed of a semiconductor film (p-Si film), a gate insulating film 12, and a gate signal line 51 made of a refractory metal such as chromium (Cr) or molybdenum (Mo). The gate signal line 51 concurrently serves as gate electrodes 11. Further arranged are a drain signal line 52 composed of Al, and a power source line 53 made of Al and serving as the drive power source of the organic EL element.

An interlayer insulating film 15 composed through sequential lamination of a $SiO_2$ film, a SiN film, and a $SiO_2$ film is formed on the entire surface over the gate electrodes 11 and the gate insulating film 12. Subsequently, a drain electrode 16 is formed by filling a metal such as Al in a contact hole created corresponding to the drain region 13d. A planarizing insulating film 17 composed of an organic resin is then formed over the entire surface for planarizing the surface.

The second TFT 40, which is the organic EL element driving TFT, is next described.

As shown in FIG. 4B, sequentially formed on an insulating substrate 10 made of a material such as quartz glass or non-alkali glass are an active layer 43 composed of a semiconductor film (p-Si film), a gate insulating film 12, and gate electrodes 41 made of a refractory metal such as Cr or Mo. The active layer 43 includes channels 43c, and source 43s and drain 43d on the outboard sides of the channels. An interlayer insulating film 15 composed through sequential lamination of a $SiO_2$ film, a SiN film, and a $SiO_2$ film is formed on the entire surface over the gate insulating film 12 and the active layer 43. Subsequently, a contact hole is created through the gate insulating film 12 and the interlayer insulating film 15 in a position corresponding to the drain region 43d. This contact hole is filled with a metal such as Al to connect the drain 43d with a power source line 53. The power source line 53 is connected to a drive power source. A planarizing insulating film 17 composed of, for example, an organic resin is then formed over the entire surface for planarizing the surface. A contact hole is formed through the planarizing insulating film 17 in a position corresponding to the source 43s. A transparent electrode made of ITO (indium tin oxide), namely, the anode 61 of the EL element 60, is formed on the planarizing insulating film 17 and through this contact hole to connect with the source 43s.

The organic EL element 60 is configured by first providing the anode 61 made of a transparent electrode composed of a material such as ITO. The emissive element layer 66 is then superimposed. The emissive element layer 66 comprises a first hole-transport layer 62 composed of MTDATA or a similar material, a second hole-transport layer 63 composed of a material such as TPD, an emissive layer 64 composed of, for example, $Bebq_2$ including quinacridone derivatives, and an electron transport layer 65 composed of a material such as $Bebq_2$. Subsequently, the cathode 67 is formed, for example, by using an alloy of magnesium (Mg) and silver (Ag), or by laminating lithium fluoride (LiF) and Al. All of the above-mentioned layers constituting the organic EL element 60 are laminated in the described order. By selecting materials which emit light of predetermined colors as the emissive materials of the emissive element layer 66, display pixels can be configured to emit light of different colors. The organic EL display device is configured by arranging the display pixels of respective colors in a matrix layout.

In the organic EL element, holes injected from the anode and electrons injected from the cathode recombine in the emissive layer. As a result, organic molecules constituting the emissive layer are excited, generating excitons. Through the process in which these excitons undergo radiation until deactivation, light is emitted from the emissive layer. This light radiates outward through the transparent anode via the transparent insulating substrate, resulting in light emission.

Figure 3A:
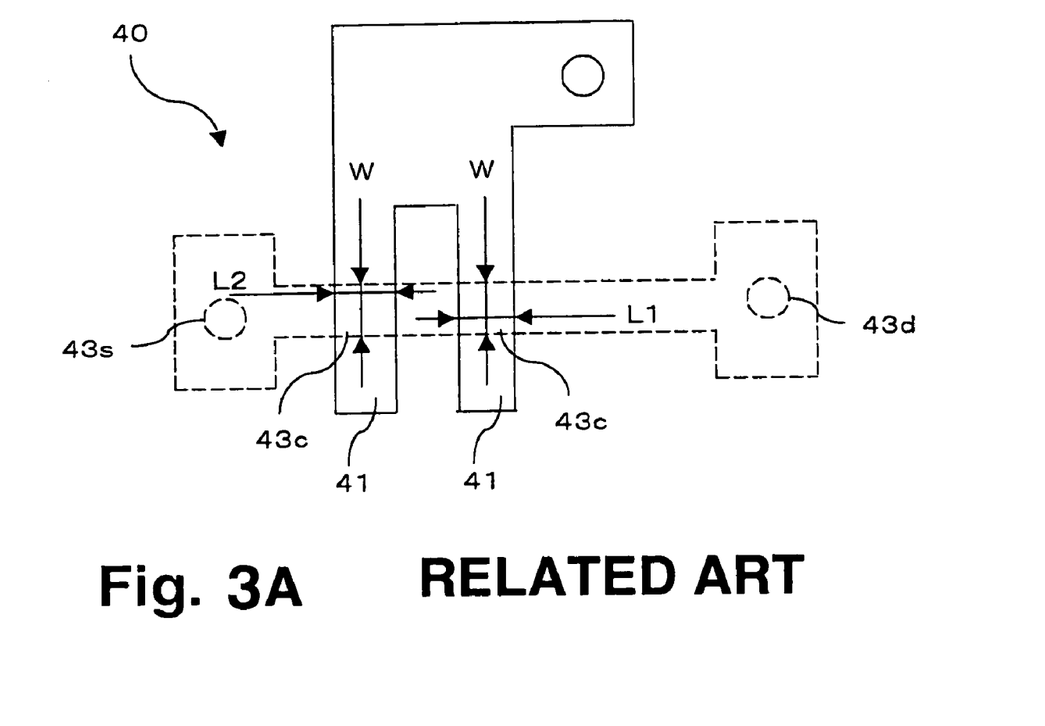
FIG. 3A shows a TFT in a display pixel.

As described above, in each display pixel 110 emitting a color, an EL element driving TFT 40 is connected for driving the organic EL element of that pixel. FIG. 3A is an enlarged view of a driving TFT 40. The transistor size of the TFT 40, namely, ratio W/L concerning the channel width W and the channel length L of the channel region in which the semiconductor film of the TFT 40 and the gate electrodes overlap (in the case of FIG. 3A, L=L1+L2) is identical in all TFTs 40.

Furthermore, emissive efficiency of the emissive layer in each display pixel differs according to the emitted color depending on the organic emissive material constituting the emissive layer.

In such an arrangement, to supply different values of current to the organic EL elements for different colors according to the emissive efficiency of each color so as to obtain the same level of luminance for the respective colors and establish an appropriate white balance, it is necessary to alter the current value of the power source for each color, or to alter the potential of the drain signal supplied to the first TFT connected in each display pixel according to each color. Specifically, more current must be made to flow in an organic EL element including an emissive layer of a color having a low emissive efficiency, compared to an organic EL element including an emissive layer of a color having a high emissive efficiency.

However, conventional display devices are disadvantageous in that, to alter the current value of the power source for each color of the display pixels, the power source line must be arranged in a complex manner within the region in which the display pixels are arranged. Further, to alter the potential of the drain signal supplied to the first TFT according to each color, complex circuitry is necessary for supplying a signal to the first TFT.

SUMMARY OF THE INVENTION

The object of the present invention is to provide an EL display device in which the sizes of the EL element driving TFTs in display pixels having EL elements for different colors are varied depending on emissive efficiency, such that the white balance among the display pixels for different colors can easily be controlled without requiring complex circuitry.

A display device according to the present invention is a color display device comprising, in each display pixel, a self-emissive element and a self-emissive element driving thin film transistor (TFT) connected to and supplying a current to the self-emissive element, wherein, among display pixels for different colors, transistor size of a self-emissive element driving TFT in a display pixel for any one color differs from that in a display pixel for another color.

The transistor size is preferably determined according to emissive efficiency of the self-emissive element.

Further, the transistor size of a self-emissive element driving TFT connected to a self-emissive element having a high emissive efficiency is preferably set smaller compared to the transistor size of a self-emissive element driving TFT connected to a self-emissive element having an emissive efficiency lower than the above high emissive efficiency.

In addition, the transistor size of a self-emissive element driving TFT connected to a self-emissive element having the highest emissive efficiency is preferably set smaller compared to the transistor size of a self-emissive element driving TFT connected to a self-emissive element having any other level of emissive efficiency.

Furthermore, the self-emissive element preferably is an electroluminescence element.

DESCRIPTION OF PREFERRED EMBODIMENT

A display device according to the present invention is described next described.

Figure 1:
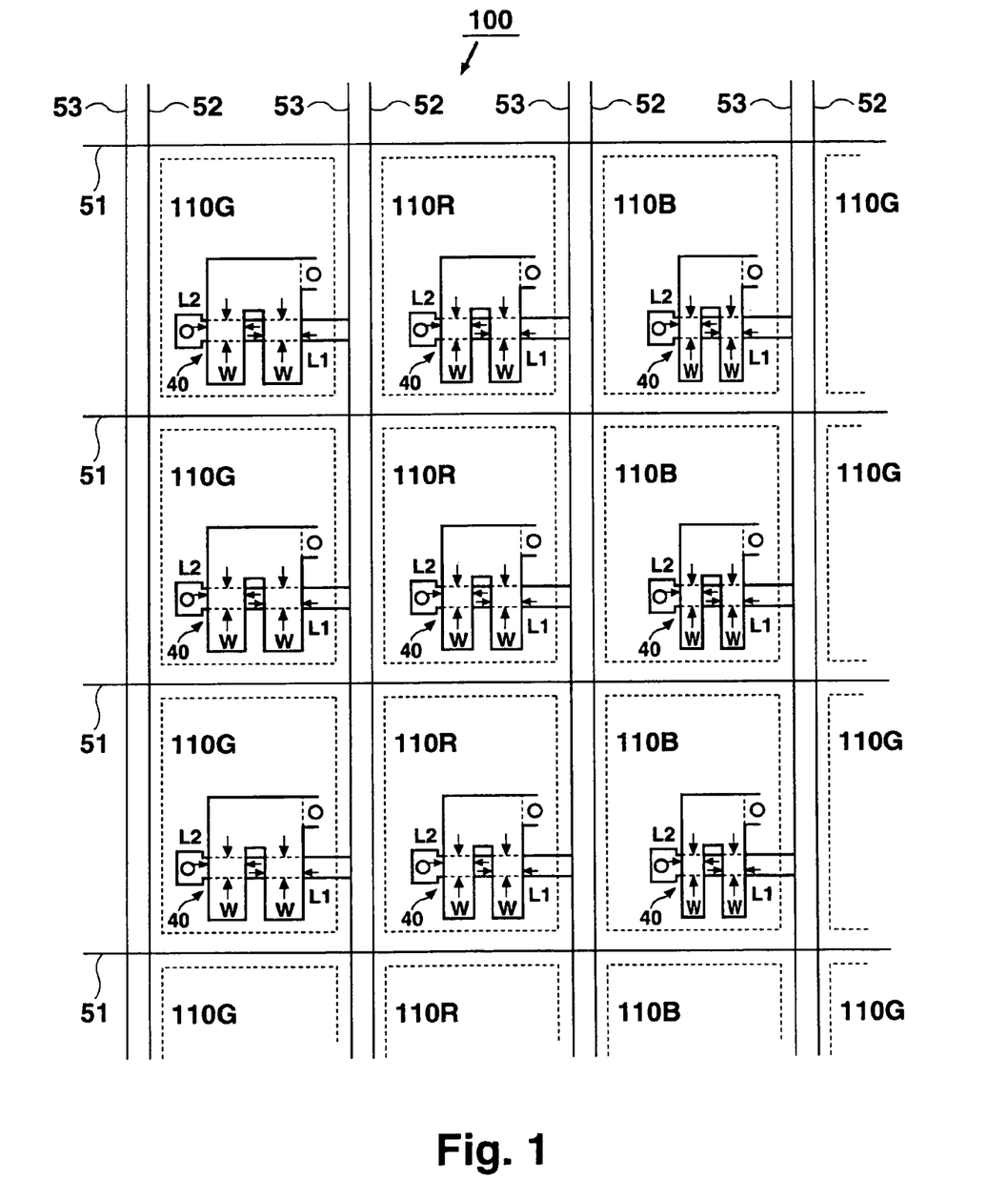
FIG. 1 is a plan view of display pixels for different colors in an EL display device according to the present invention, in which TFT portions in the respective pixels are enlarged.

FIG. 1 is a plan view of an EL display device 100. In FIG. 1, portions corresponding to an EL element driving TFT for supplying a current to an EL element are shown enlarged.

The figure illustrates an example in which the display pixels emit either red (110R), green (110G), or blue (110b). Among the components of a display pixel shown in the above-described FIG. 3, the only components shown enlarged in FIG. 1 are the gates 41 and the active layer 43 including the channel 43c, source 43s, and drain 43d of a driving TFT 40 arranged within a display pixel.

As can be seen in FIG. 1, in the EL display device 100, a plurality of gate signal lines 51 are arranged in a horizontal direction in the figure, and a plurality of power source lines 52 and drain signal lines 53 are arranged in a vertical direction in the figure. These lines 51 and 53, and 51 and 52, intersect one another.

As shown in FIG. 3, in an area near an intersection, a switching TFT 30 for controlling the timing for supplying a current to an EL element 60 is formed connected to the two signal lines 51,53. An EL element driving TFT 40 for supplying a current to the organic EL element 60 to drive the element is formed with its gate connected to the source 13s of the TFT 30. Further formed is the organic EL element 60 having an anode 61 connected to the source 43s of the EL element driving TFT 40. As shown in FIG. 1, display pixels for respective colors 110R, 110B, and 110G are arranged in a matrix.

The organic EL element 60 has a structure identical to the structure shown in FIG. 4B, and its explanation will not be repeated. The anode 61 is made of ITO, the hole transport layer 63 is composed of MTDATA (first hole-transport layer) and TPD (second hole-transport layer), the emissive layer 64 is composed of quinacridone, and the emissive element layer (electron transport layer) 65 is composed of Bebq$_2$. The cathode 67 may be formed of an alloy of magnesium (Mg) and silver (Ag), or materials such as lithium fluoride (LiF). Chemical formulas for MTDATA, TPD, and Bebq$_2$ are as follows.

MTDATA: 4,4',4"-tris(3-methylphenylphenylamino)triphenylamine

TPD: N,N'-diphenyl-N,N'-di(3-methylphenyl)-1,1'-biphenyl-4,4'-diamine

Bebq$_2$: bis(10-hydroxybenzo[h]quinolinato)beryllium

Transistor size W/L of an EL element driving TFT connected to each of the display pixels 110R, 110B, 110G is next explained.

In the present invention, transistor size of a TFT refers to the ratio of the channel width W to the channel length L in the TFT channel, namely, W/L.

In the present embodiment, the emissive material disposed in a green display pixel has the highest emissive efficiency. The emissive material disposed in a red display pixel has the second highest emissive efficiency, and the emissive material used in a blue display pixel has the lowest emissive efficiency. More specifically, the present embodiment refers to a case in which the ratio among the green emissive efficiency $G_{eff}$, the red emissive efficiency $R_{eff}$, and the blue emissive efficiency $B_{eff}$ can be expressed as $G_{eff}$:$R_{eff}$:$B_{eff}$=10:3.8:1.8.

L of the transistor size W/L in an EL element driving TFT in FIG. 1 equals to L1+L2.

Among the transistor sizes (W/L) of driving TFTs in all display pixels, the smallest W/L is used to form the TFT of a green display pixel 110G because the emissive efficiency of the emissive material used for the emissive element layer of a green display pixel is the highest.

The W/L of display pixels for other colors 110R, 110B is larger than the W/L of a green display pixel 110G.

W/L may be varied by changing L while W is fixed, by changing W while L is fixed, or by changing both W and L.

Specifically, as the ratio between emissive efficiencies of respective colors is $G_{eff}$:$R_{eff}$:$B_{eff}$=10:3.8:1.8, when the channel length L in each TFT is fixed at 5 μm, the TFT channel width of a green display pixel $W_G$ may be designated at 5 μm, the TFT channel width of a red display pixel $W_R$ at 13 μm, and the TFT channel width of a blue display pixel $W_B$ at 28 μm. This example is diagrammatically shown in FIGS. 1A–1C.

Figure 1A:
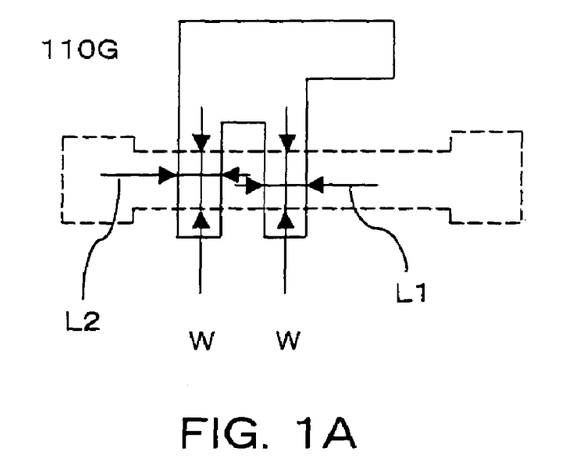
FIGS. 1A, 1B, and 1C are diagrammatic illustrations showing examples in which the gate width W is varied while the gate length L is fixed.
Figure 1B:
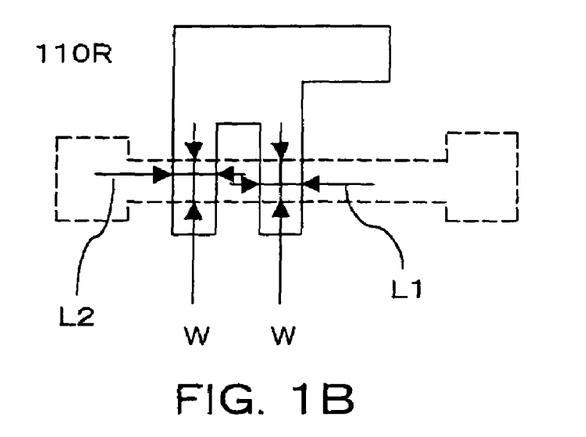
Figure 1C:
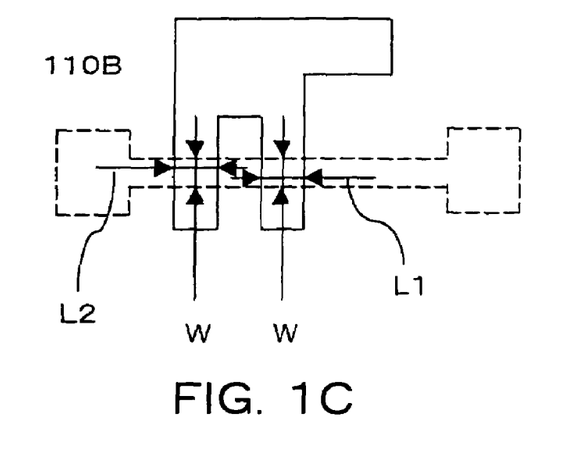

More specifically, $W_G$:$W_R$:$W_B$=1/$G_{eff}$:1/$R_{eff}$:1/$B_{eff}$=1/10:1/3.8:1/1.8=1:2.6:5.6=5:13:28.

By designating W/L according to the emissive efficiency of each color as described above, it is no longer necessary to adjust the current value of the EL driving power supply before supplying for each color, or to adjust, according to each color, the drain signal from the drain signal line which controls the voltage supplied from the source of the switching TFT 30 to the gate of the EL driving TFT 40. When the voltages need not be adjusted, it is no longer necessary to arrange the power source lines in a complex manner within the display region of the EL display device, eliminating causes of line breakage and short-circuits. In addition, it is no longer necessary to provide a separate circuit for controlling the voltage supplied to the drain of the switching TFT to control the voltage supplied to the gate of the EL element driving TFT.

Figure 1D:
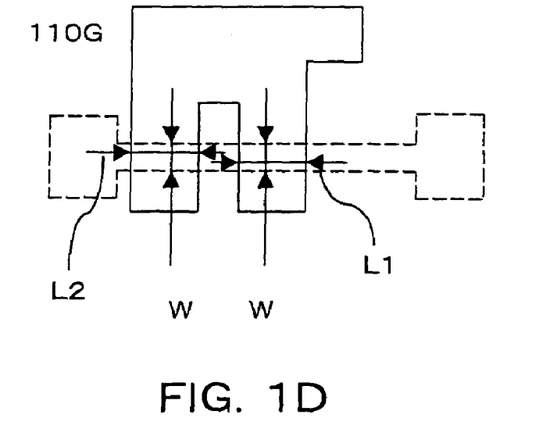
FIGS. 1D, 1E, and 1F are diagrammatic illustrations showing examples in which the gate length L is varied while the gate width W is fixed.
Figure 1E:
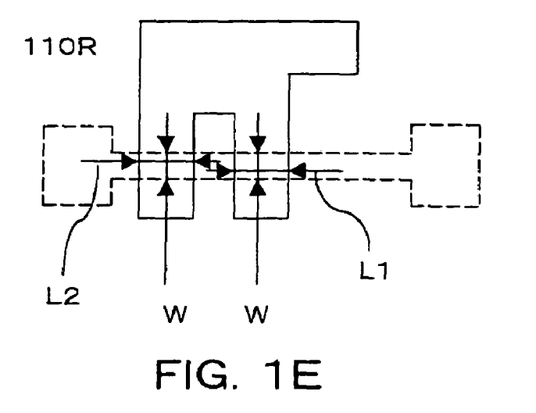
Figure 1F:
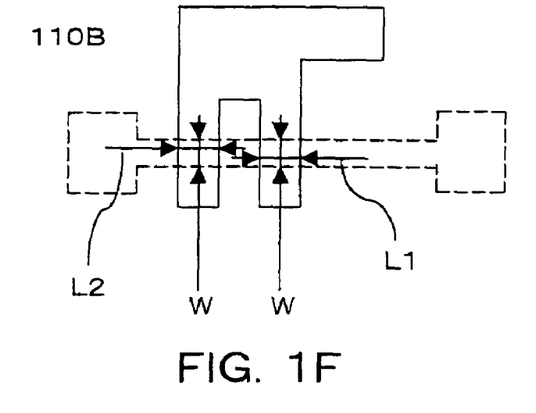

While FIGS. 1A–1C illustrate a case in which the channel length L, among the channel width W and the channel length L, is a fixed value, the present invention is not limited by this feature. The channel width W may be fixed while varying the channel length L in the display pixels for different colors. More specifically, as shown in FIGS. 1D–1E, the channel length L of a green display pixel 110G may be designated at the largest value, the channel length L of a red display pixel 110R at the next largest value to that of a green display pixel, and the channel length L of a blue display pixel 110B at the smallest value.

According to the present embodiment as described above, W/L of an EL driving TFT connected to a display pixel for each color is varied depending on the emissive efficiency of the emissive material of the emissive element layer disposed in that display pixel. This arrangement allows a voltage from the power source to be altered for each color, eliminating the need to arrange power source lines in a complex manner within the display region of the EL display device. Further, circuit configuration is prevented from becoming complex by eliminating the need to alter a drain signal supplied to a switching TFT 30 according to each color.

The present embodiment illustrates a case in which, with the emitted colors being red, green, and blue, the smallest value is assigned for the transistor size W/L of an EL driving TFT connected to a green display pixel having the highest emissive efficiency, a larger value is assigned for the W/L of an EL driving TFT connected to a red display pixel having the second highest emissive efficiency, and the largest value is assigned for the W/L of an EL driving TFT connected to a blue display pixel having the lowest emissive efficiency. However, the emissive efficiency of each color is changed depending on the emissive material used in the emissive layer. Accordingly, the advantages of the present invention can be realized when display pixels for the color having the highest emissive efficiency (for example, green) and the second highest emissive efficiency (which may be red) have the same W/L, while a display pixel for only the remaining color (blue) has a larger W/L. Alternatively, display pixels for blue having the lowest emissive efficiency and red having the next lowest emissive efficiency may have the same W/L, while a display pixel for the remaining color having the highest emissive efficiency, which may be green, has a smaller W/L.

To achieve an appropriate white balance of an indication, the value of current flowing in the TFT for each color is typically adjusted according to the chromaticity of the emissive material for each color, other than according to the emissive efficiency of the material. The transistor size may therefore be adjusted according to chromaticity.

Figure 6:
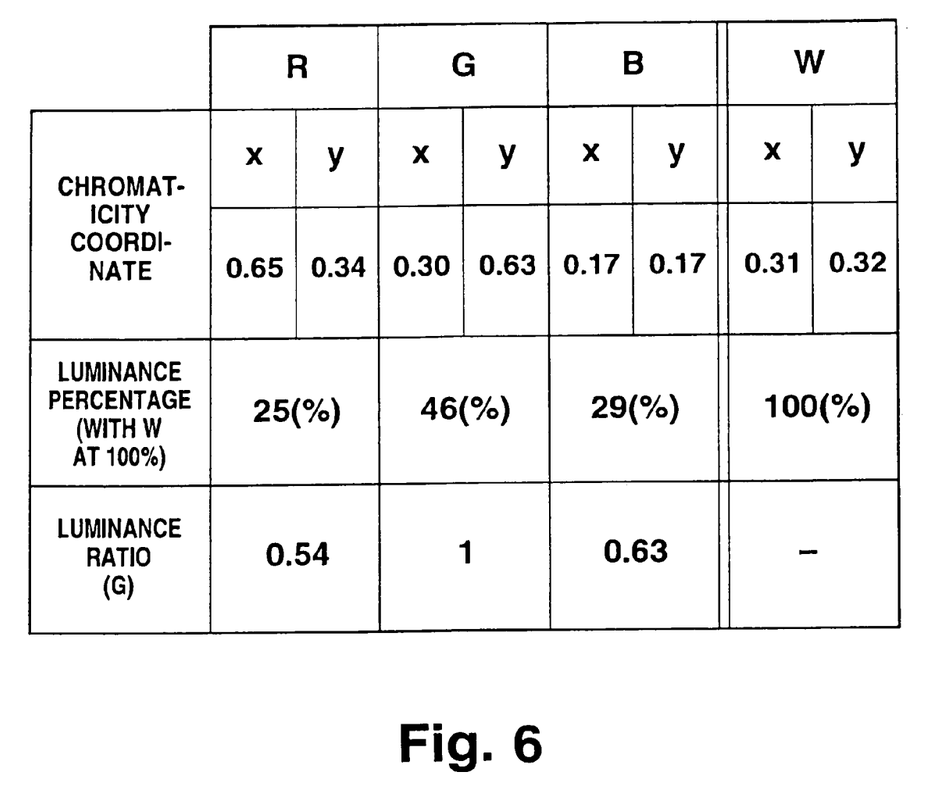
FIG. 6 is a diagram for explaining a method for calculating the emissive luminance ratio for R, G, and B when indicating white.

More specifically, the target white color may be denoted by the chromaticity coordinates (x,y:0.31, 0.32) of the standard white light source (C light source) by NTSC scheme. When the chromaticity of R, G, and B light emitted from the organic EL elements is expressed by the coordinates indicated in the upper row of FIG. 6, luminance required for each of R, G, and B to achieve the white color at 100% luminance is determined as, for example, 25%:46%:29%. Denoting this by luminance ratio, R:G:B=0.54:1:0.63.

When the ratio of emissive efficiencies among different colors of organic EL elements is, as in the above example, 10:3.8:1.8 for green, red, and blue, the ratio of necessary current amount to accomplish the luminance ratio of G:R:B=1:0.54:0.63 is G:R:B=1/10:0.54/3.8:0.63/1.8=1:14.2:35.

The sizes of the driving TFTs for supplying current to the organic EL elements for R, G, and B can be determined such that the ratio of the current amounts for R, G, and B equals to the above example ratio by taking into account the chromaticity of R, G, and B, the chromaticity of the target white color, and the emissive efficiency for each color. Simply by selecting such transistor sizes, the white color at 100% luminance can be achieved requiring no further arrangements.

In an EL display device in which the ratio among transistor sizes of the driving TFTs are determined according to the above method, luminance balance among different colors is already adjusted by the transistor sizes. Accordingly, control of white balance is extremely facilitated. Further, it is no longer necessary to apply a high voltage to the driving TFTs of EL elements for a particular color to indicate white, allowing improvement of life of the overall display device.

When different materials are used, the chromaticity coordinate values of the R, G, and B lights emitted by the organic EL elements are changed, which in turn alters the luminance ratio among R, G, and B. In addition, the emissive efficiencies would also differ. Accordingly, the transistor sizes should be determined according to these variable factors, and should not be limited by the numeric values of the above example.

While an organic EL display device is used as an example in the above embodiment, the present invention is not limited to an organic EL display device. The present invention may be implemented in an inorganic EL display device comprising, instead of an organic EL element, an inorganic EL element using an inorganic emissive material as the emissive element. Alternatively, the present invention may be implemented in a display device having a fluorescent layer between two electrodes as the emissive layer.

Furthermore, although the present embodiment illustrates a display device having a stripe arrangement in which the display pixels for the same color are vertically aligned, the present invention may be implemented in a display device having a delta arrangement to realize the same advantages.

In the present embodiment, to achieve color indication by emitting lights of R, G, and B in a plurality of display pixels arranged in a matrix on a substrate as shown in FIG. 9, different materials are used in organic EL elements 160 for the respective colors of red, green, and blue. A differing material is used for each color especially concerning the organic compound having emissive function.

For example, in a red organic EL element 160R, ITO is used for the anode 161, MTDATA (first hole transport layer) and TPD (second hole transport layer) for the hole transport layer 162, Bebq$_2$ doped with 2% ZnPr for the emissive layer 163, and a MgIn alloy for the cathode 166.

In a green organic EL element 160G, ITO is used for the anode 161, MTDATA (first hole transport layer) and TPD (second hole transport layer) for the hole transport layer 162, Bebq$_2$ for the emissive layer 163, and a MgIn alloy for the cathode 166.

In a blue organic EL element 160B, ITO is used for the anode 161, MTDATA (first hole transport layer) and TPD (second hole transport layer) for the hole transport layer 162, 1AZM-Hex for the emissive layer 163, and a MgIn alloy for the cathode 166. Other than the above, the combination comprising ITO (anode), MTDATA (first hole transport layer) and TPD (second hole transport layer), OXD-8 (emissive layer), and MgIn alloy (cathode) can be employed in a blue organic EL element 160B.

The official names for the above-mentioned chemical abbreviations are as follows.

ZnPr: 5,10,15,20-tetraphenylporphyrinato zinc
MTDATA: 4,4',4''-tris(3-methylphenylphenylamino)triphenylamine
TPD: N,N'-diphenyl-N,N'-di(3-methylphenyl)-1,1'-biphenyl-4,4'-diamine
Bebq$_2$: bis(10-hydroxybenzo[h]quinolinato)beryllium
1AZM-Hex: (N,N'-disalicylidene-1,6-hexanediaminato) zinc
OXD-8: 3-bis[5-p-dimethylaminophenyl)-1,3,4-oxadiazol-2-yl] benzene Using these materials in the organic EL elements 160 for R, G, and B (160R, 160G, 160B), the emissive efficiencies obtained at the present are denoted as: element 160G>element 160R>element 160B. In an organic EL element 160, emissive luminance is dependent upon current (current density). Accordingly, to obtain equivalent luminance for each color by supplying an equivalent current to each display pixel, the transistor sizes of the driving TFTs should be designated, as described above, according to the expression: TFT for green pixel<TFT for red pixel<TFT for blue pixel.

Although the EL element driving TFTs in the present embodiment are described as having the so-called top gate type structure in which the gate electrodes are provided above the active layer with the gate insulating film disposed therebetween, the benefits of the present invention can similarly be achieved using a bottom gate type structure in which the gate electrodes are provided beneath the active layer with the gate insulating film disposed therebetween.

While the present embodiment is described by illustrating several pixels within an EL display device, the present invention can be applied to any desired number of display pixels such as VGA (640×480), SVGA (800×600), XGA (1024×768), or SXGA(1280×1024).

According to the present invention, there is provided an EL display device in which white balance among the display pixels for different colors can easily be controlled without requiring complex circuitry.

What is claimed is:

1. A color display device in which display pixels for indicating different colors are provided in plural numbers for each color and arranged in a matrix, said color display device comprising, corresponding to each display pixel:
    a self-emissive element for emitting light of a predetermined color;
    a driving thin film transistor (TFT) having a first end electrical communication with said self-emissive element for supplying a drive current to said self-emissive element and a second end in electrical communication with a power source with a constant voltage; and
    a switching TFT having a first end in electrical communication with a data line and a second end in electrical communication with a gate of said driving TFT, said switching TFT controls whether a data signal from said data line is supplied to said gate of said driving TFT; wherein
    size of said driving TFT in a display pixel for one color is altered from that in a display pixel for another color; wherein
    size of a driving TFT connected to self-emissive element having a high emissive efficiency is set smaller compared to said size of a driving TFT connected to a self-emissive element having a low emissive efficiency.

2. The color display device as claimed in claim 1, wherein said switching TFT controls tuning on and off of the driving TFT and a current therethrough.

3. The color display device as claimed in claim 1, wherein said size of a driving TFT connected to self-emissive element having a highest emissive efficiency is set smaller compared to said size of a driving TFT connected to a self-emissive element having any other level of emissive efficiency.

4. The color display device as claimed in claim 3, wherein color of the self-emissive element having the highest emissive efficiency is green.

5. The color display device as claimed in claim 1, wherein said size of a driving TFT connected to self-emissive element having a lowest emissive efficiency is set larger compared to said size of a driving TFT connected to a self-emissive element having any other level of emissive efficiency.

6. The color display device as claimed in claim 5, wherein color of the self-emissive element having the lowest emissive efficiency is either red or blue.

7. The color display device as claimed in claim 1, wherein said size of said driving TFT is made successively larger as the emissive efficiency decrease.

8. The color display device as claimed in claim 1, wherein said self-emissive element is an electroluminescence element.

9. The color display device as claimed in claim 1, wherein said size of said driving TFT is altered by changing a gate width according to emitting color while a gate length is fixed.

10. The color display device as claimed in claim 1, wherein
said size of said driving TFT is altered by changing a gate length according to emitting color while a gate width is fixed.

11. A color display device in which a display pixels for indicating different colors are provided in plural numbers for each color and arranged in a matrix, said color display device comprising, corresponding to each display pixel:
a self-emissive element for emitting light of a predetermined color;
a driving thin film transistor (TFT) having a first end in communication with said self-emissive element for supplying a drive current to said self-emissive element; and
a switching TFT having a first end in communication with a data line and a second end in communication with a gate of said driving TFT, said switching TFT controls whether a data signal from said data line is supplied to said gate of said driving TFT; wherein
size of said driving TFT in a display pixel for one color is set for every color in accordance with:
an emission efficiency of said emissive element disposed at said display pixel;
a chromaticity of each color emitted by respective emissive element; and
the chromaticity of target display white of the display device; and
the size of said driving TFT of the display pixel of any one color, among the display pixel of various colors, is different from the size of said driving TFT of the display pixel of another color.

12. A color display device according to claim 11, wherein said emissive element is an organic electroluminescence element comprising the emissive layer using an organic compound between first electrode and second electrode.

13. A color display device in which a display pixels for indicating different colors are provided in plural numbers for each color and arranged in a matrix, said color display device comprising, corresponding to each display pixel:
a self-emissive element for emitting light of a predetermined color;
a driving thin film transistor (TFT) having a first end in communication with said self-emissive element for supplying a drive current to said self-emissive element; and
a switching TFT having a first end in communication with a data line and a second end in communication with a gate of said driving TFT, said switching TFT controls whether a data signal from said data line is supplied to said gate of said driving TFT; wherein
size of said driving TFT in a display pixel for red, for green and for blue is set on the basis of:
the emission of efficiency of the emissive element of each display pixel; and
a luminance ratio of red to green to blue in accordance with each chromaticity of red, green and blue emitted by respective emissive element of the display pixel and with the chromaticity of target display white of the display device; wherein
the emissive area of the display pixel of any one color among said display pixel of red, for green, and for blue is different in size from the emissive area of the display pixel of another color.

14. A color display device according to claim 13 wherein said emissive element is an organic electroluminescence element comprising the emissive layer using an organic compound between first electrode and second electrode.

* * * * *